(12) United States Patent
Lin

(10) Patent No.: US 7,182,610 B2
(45) Date of Patent: Feb. 27, 2007

(54) ELECTRICAL CONNECTOR AND CIRCUIT BOARD SECURING STRUCTURE

(75) Inventor: Tung-Chang Lin, Taipei (TW)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/382,230

(22) Filed: Mar. 5, 2003

(65) Prior Publication Data

US 2003/0171014 A1    Sep. 11, 2003

(30) Foreign Application Priority Data

Mar. 8, 2002    (TW) .............................. 91202794 U

(51) Int. Cl.
*H01R 12/00* (2006.01)
*H05K 1/00* (2006.01)

(52) U.S. Cl. ........................ 439/79; 439/567

(58) Field of Classification Search ............... 439/79, 439/80, 567, 78, 82, 84

See application file for complete search history.

(56) References Cited

U.S. PATENT DOCUMENTS

| | | | | | |
|---|---|---|---|---|---|
| 5,066,237 | A | * | 11/1991 | Shiley | 439/82 |
| 5,478,261 | A | * | 12/1995 | Bogese, II | 439/676 |
| 5,702,271 | A | * | 12/1997 | Steinman | 439/676 |
| 6,162,091 | A | * | 12/2000 | Kurotori et al. | 439/567 |
| 6,863,545 | B2 | * | 3/2005 | Peloza | 439/79 |

* cited by examiner

*Primary Examiner*—Javaid H. Nasri
(74) *Attorney, Agent, or Firm*—Robert J. Zeitler

(57) ABSTRACT

In an electrical connector and circuit board securing structure, the electrical connector includes an insulating housing, a plurality of conductive terminals and an outer housing. Two sides of the outer housing are each punched to form a wing. The wing extends downwardly to form a post. The circuit board is provided with an aperture. The two posts fit into the notches so that the outer housing of the electrical connector can be positioned firmly on the circuit board with good positioning between the two, will not vibrate, and can withstand plugging and unplugging.

17 Claims, 10 Drawing Sheets

PRIOR ART

PRIOR ART

ELECTRICAL CONNECTOR AND CIRCUIT BOARD SECURING STRUCTURE

FIELD OF THE INVENTION

The invention relates to an electrical connector and circuit board securing structure, more particularly to one adapted for use in a miniature-USB electrical connector with posts on two sides of an outer housing of the electrical connector to position on a circuit board so that there is firm positioning between the two.

BACKGROUND OF THE INVENTION

Referring to FIG. 1, a conventional miniature-USB electrical connector 10a is secured to a circuit board 20a. In order to reduce the height of the electrical connector 10a, an opening 21a is generally formed in the circuit board 20a so that the electrical connector 10a can be received in the opening 21a so as to reduce the height of the electrical connector 10a projecting from the upper surface of the circuit board 20a. Such is a sunken plate type design.

Left and right sides of an outer housing 11a of the electrical connector 10a are respectively punched to form wings 12a. In addition, two solder plates 22a corresponding to the wings 12a are fixedly provided on the upper surface of the circuit board 20a. The two wings 12a lap the two solder plates 22a, and solder paste is applied between the two wings 12a and the two solder plates 22a so that the electrical connector 10a can be secured onto the circuit board 20a via soldering.

Referring to FIG. 2, the wings 12a on two sides of the outer housing 11a of the electrical connector 10a can also be provided with a through hole 13a for enhancing the solder securing effect so that the securing force between the two wings 12a and the two solder plates 22a can be increased.

However, in the aforesaid conventional electrical connector 10a, as the two sides of the outer housing 11a are soldered and secured to the upper surface of the circuit board 20a merely by the wings 12a, there is the problem of unsatisfactory positioning effect, so that the electrical connector 10a cannot be positioned on the circuit board 20a firmly, is likely to vibrate, and cannot endure plugging and unplugging operations during insertion and removal thereof, which may lead to loosening or disengagement between the electrical connector 10a and the circuit board 20a.

Therefore, it can be seen from the above that the electrical connector and circuit board securing structure clearly is inconvenient and has drawbacks in actual use, and needs to be improved.

Accordingly, the inventor, believing that there are ways to eliminate the drawbacks, indulged in researches and employed theoretical principles, finally proposed this invention which is a reasonable design that can effectively overcome the drawbacks.

SUMMARY OF THE INVENTION

The main object of the invention is to provide an electrical connector and circuit board securing structure in which posts on two sides of an outer housing of the electrical connector are positioned on a circuit board so that the positioning effect between the two is better. Therefore, the electrical connector can be positioned on the circuit board firmly and can withstand plugging and unplugging. The electrical connector and the circuit board will not vibrate or disengage relative to each other.

In order to achieve the above object, the invention provides an electrical connector and circuit board securing structure, which includes an electrical connector and a circuit board. The electrical connector includes an insulating housing, a plurality of conductive terminals and an outer housing. Two sides of the outer housing are each provided with a wing. The wing extends downwardly to form a post. The circuit board is formed with an aperture. The electrical connector is received in the aperture. Two sides of the aperture each forms a notch. The two posts fit into the two notches.

To enable the Examiner to further appreciate the features and technical contents of the invention, reference is made to the following detailed description and accompanying drawings of the invention. It is noted that the drawings are provided merely for reference and illustration purposes, and are not intended to limit the invention.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE DISCLOSED EMBODIMENTS

Figure 1:
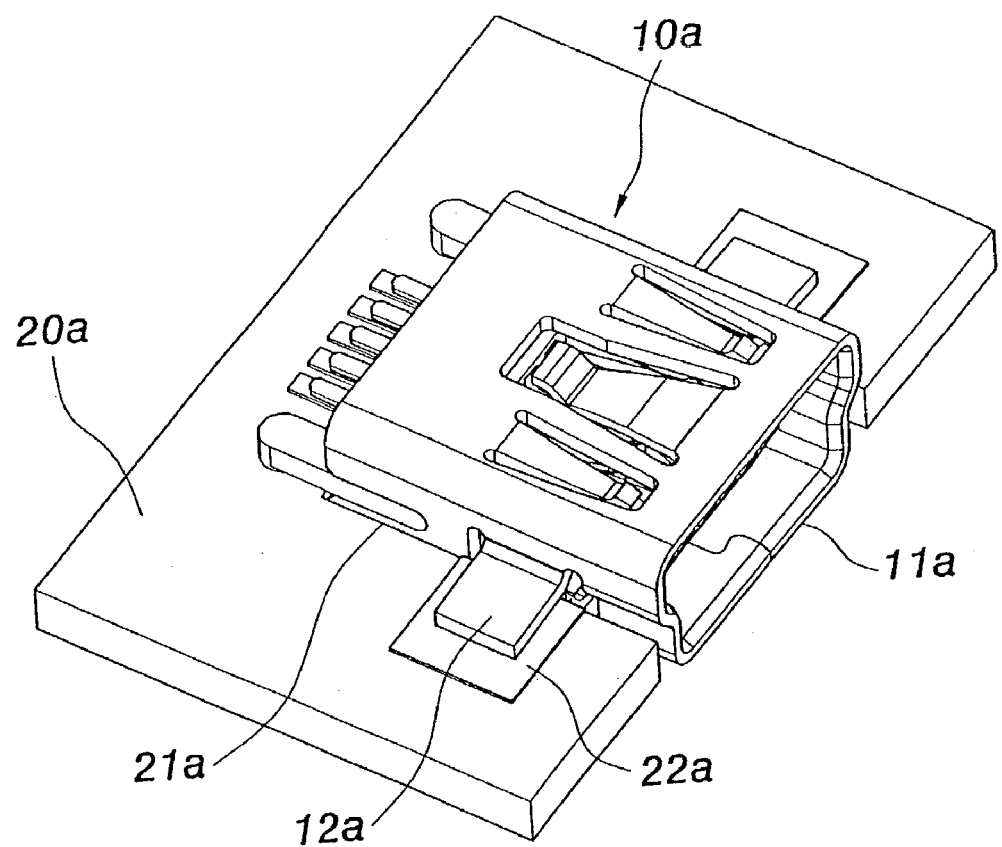
FIG. 1 is a perspective view of a conventional electrical connector and circuit board securing structure.
Figure 2:
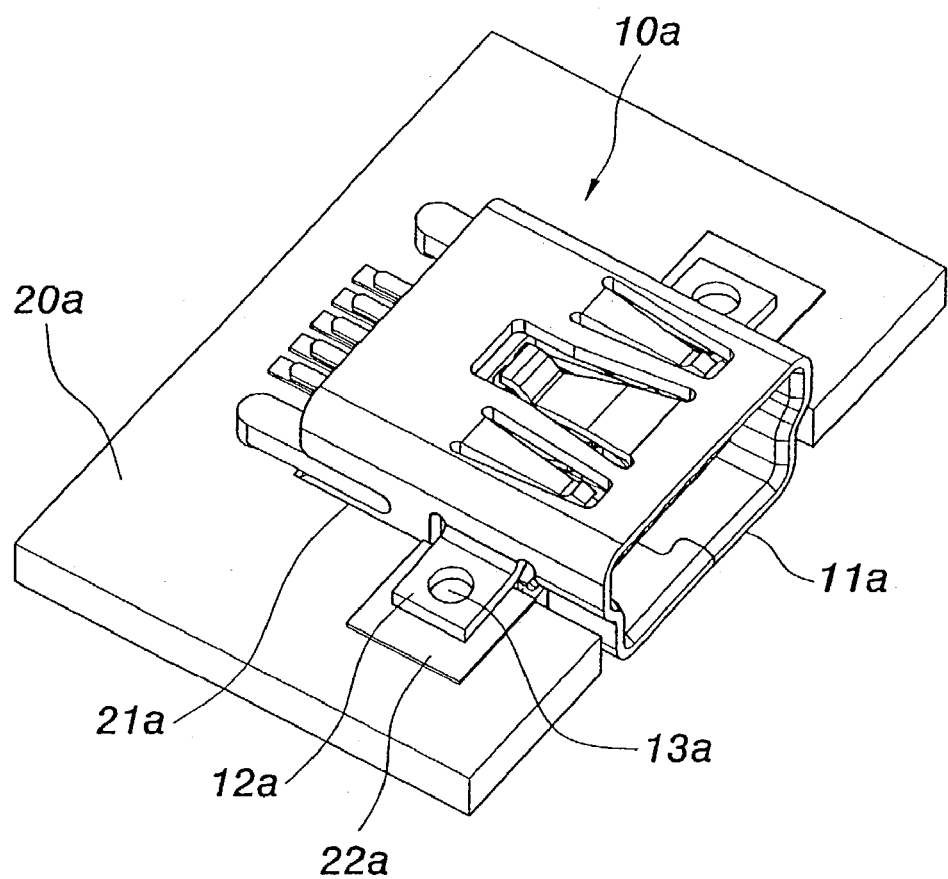
FIG. 2 is a perspective view of another conventional electrical connector and circuit board securing structure.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 3:
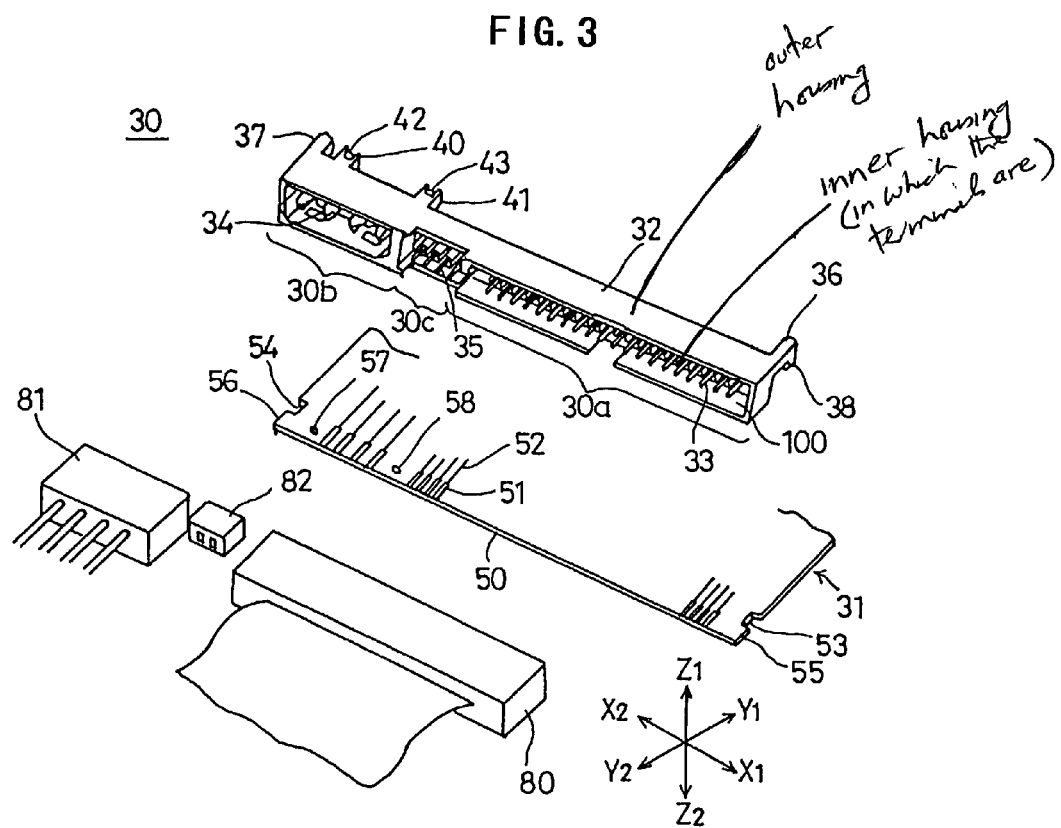
FIG. 3 is an exploded perspective view of the first embodiment of the invention.
Figure 4:
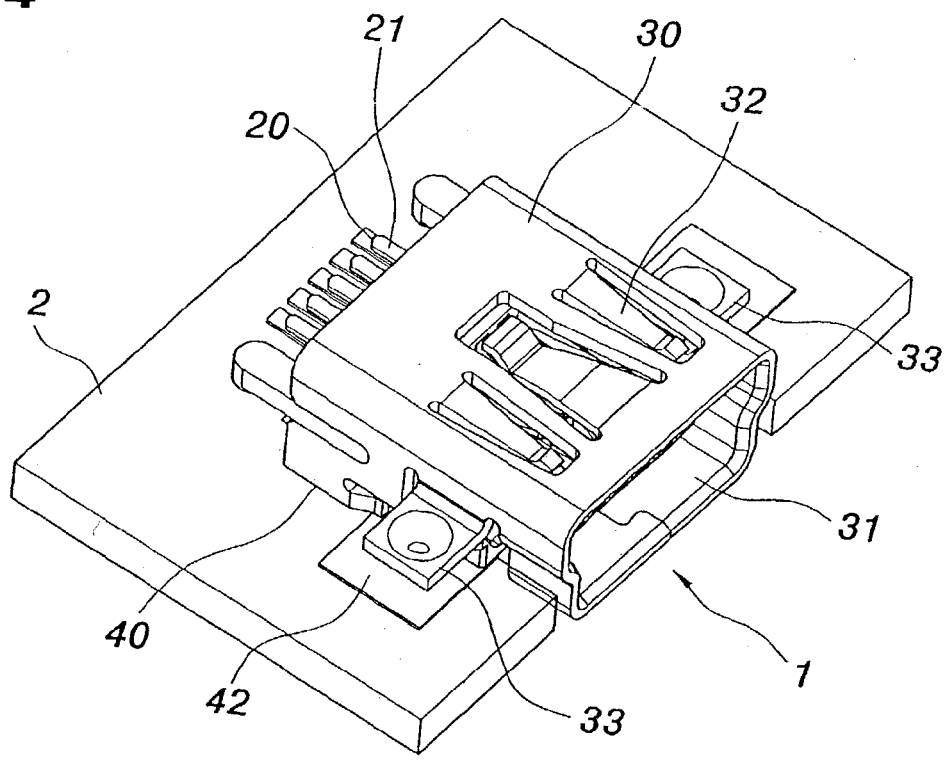
FIG. 4 is a perspective view of the first embodiment of the invention.
Figure 5:
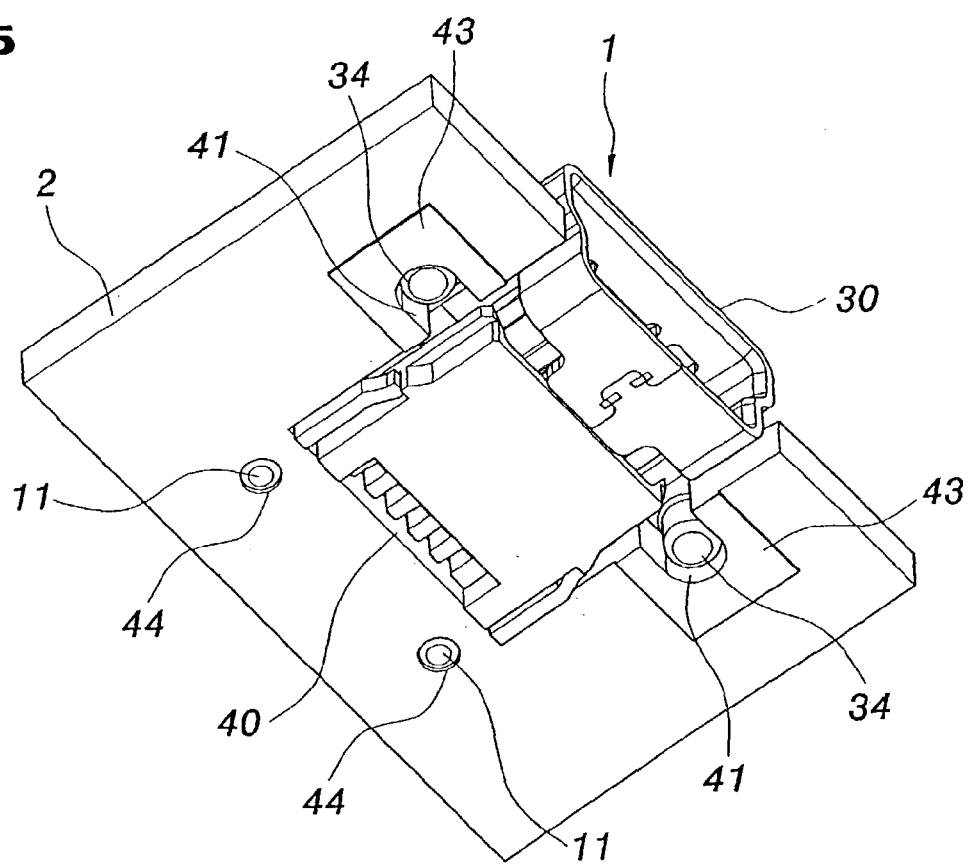
FIG. 5 is a perspective view of the first embodiment of the invention taken from another angle.

Referring to FIGS. 3, 4 and 5, the invention provides an electrical connector and circuit board securing structure, which includes an electrical connector 1 and a circuit board 2. The electrical connector includes an insulating housing 10, a plurality of conductive terminals 20 and outer housing 30. The insulating housing 10 is formed of an insulating material such as plastic. Two sides of the bottom portion of the insulating housing 10 are respectively provided with downwardly extending positioning posts 11. The conductive terminals 20 are secured to the insulating housing 10 to contact a mating connector. The conductive terminals 20 each have one end extending outwardly to form a connecting leg portion 21. The connecting leg portions 21 extend outwardly of the outer housing for soldering onto the circuit board 2.

Figure 6:
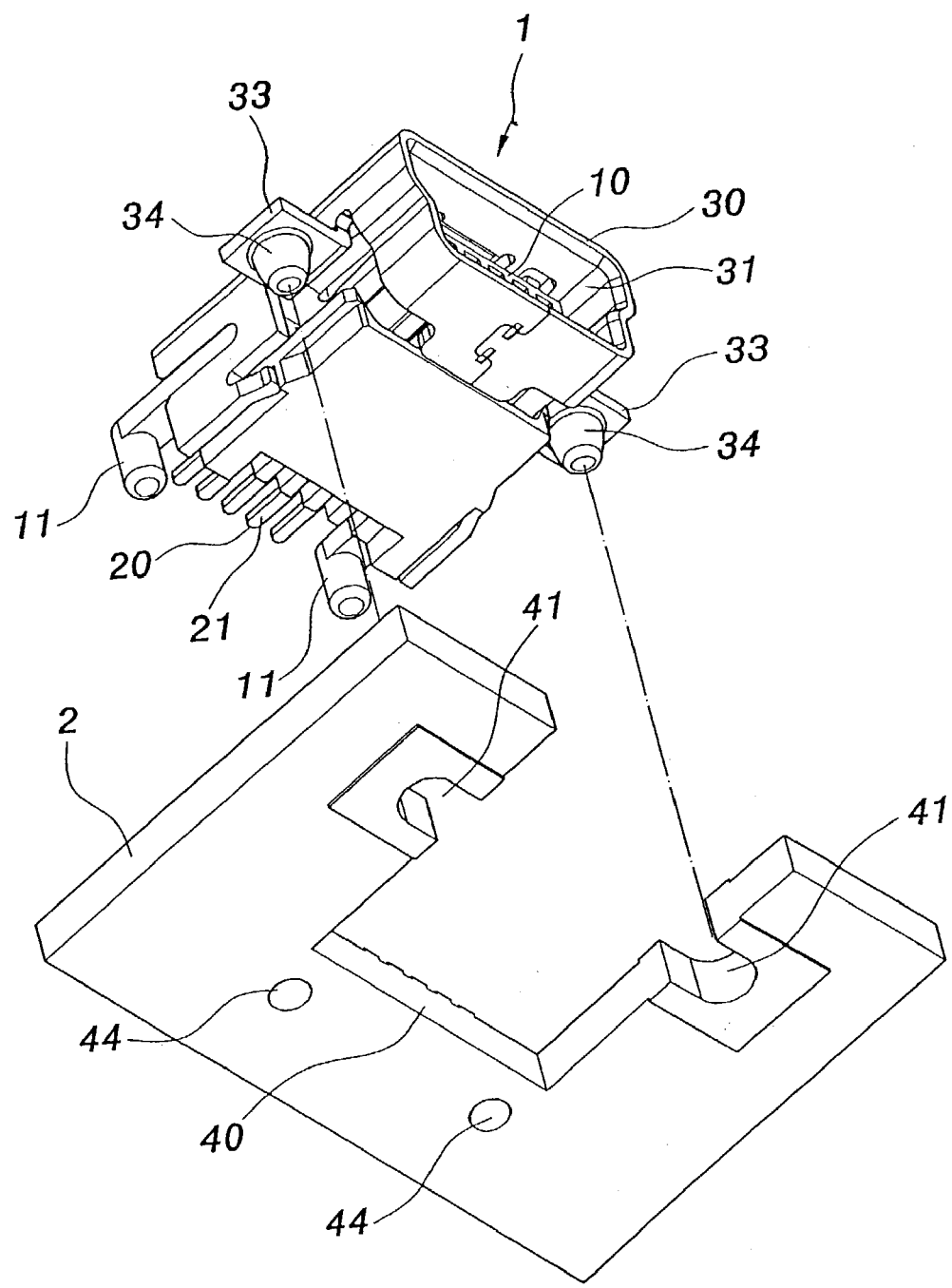
FIG. 6 is an exploded perspective view of the second embodiment of the invention.

The outer housing 30 is formed of a metal material, and is a hollow housing with a front end forming an opening. The front end of the outer housing 30 forms an insertion opening 31. The insertion opening 31 can connect with the mating connector. The top portion of the outer housing 30 is provided with a plurality of elastic plates 32. The elastic plates 32 slightly project from the inner wall of the outer housing 30 for elastically clamping the mating connector. The outer housing 30 surrounds the exterior of the insulating housing 10 to achieve a shielding protecting effect. Left and right sides of the outer housing 30 are each punched to form a horizontally extending wing 33. The bottom portion of the wing plate 33 extends downwardly to form a post 34. The post 34 has a substantially hollow cylindrical or conical shape (as in FIG. 6).

The circuit board 2 is provided with an aperture 40 such that the electrical connector 1 can be received in the aperture 40 for reducing the height of the electrical connector 1 projecting from the upper surface of the circuit board 2. Two sides of the aperture 40 each form a through notch 41. The peripheries of the top portion and the bottom portion of the notch 41 are respectively provided with an upper solder plate 42 and a lower solder plate 43. The upper solder plate 42 and the lower solder plate 43 are respectively secured to the upper surface and the lower surface of the circuit board 2. In addition, the circuit board 2 is provided with two positioning holes 44 corresponding to the positioning posts 11.

The wings 33 on the two sides of the outer housing 30 lap the two upper solder plates 42, and the two posts 34 fit in the two notches 41. Solder paste is applied between the two wings 33 and the two upper solder plates 42 so that the two wings 33 and the two upper solder plates 42 are soldered together. Solder paste is applied between the two posts 34 and the two lower solder plates 43 so that the two posts 34 and the two lower solder plates 43 can be soldered together. Hence, the electrical connector 1 can be secured to the circuit board 2 via soldering. In addition, the two positioning posts 11 on the bottom portion of the insulating housing 10 fit in the two positioning holes in the circuit board 2 to assist positioning. By means of the aforesaid construction, an electrical connector and circuit board securing structure according to the invention is formed.

In the electrical connector 1 of the invention, the posts 34 on the two sides of the outer housing 30 are positioned in the two notches 41 in the circuit board 2. Therefore, the electrical connector 1 and the circuit board 2 can be firmly positioned, and the positioning effect of the two is relatively good so that the electrical connector 1 can be firmly positioned on the circuit board 2, and can endure plugging and unplugging during insertion or removal thereof. Loosening or disengagement between the electrical connector 1 and the circuit board 2 will not occur. The two positioning posts 11 on the bottom portion of the insulating housing 10 fit in the two positioning holes in the circuit board 2 to assist positioning so as to enhance stability.

Furthermore, in the electrical connector 1 of the invention, the wings 33 and posts 34 on the two sides of the outer housing 30 are soldered and secured to the upper solder plates 42 and the lower solder plates 43 on the upper surface and the lower surface of the circuit board 2. Therefore, the solder area between the electrical connector 1 and the circuit board 2 can be increased considerably. The securing force between the two is better so that the electrical connector 1 can be firmly secured on the circuit board 2.

Figure 7:
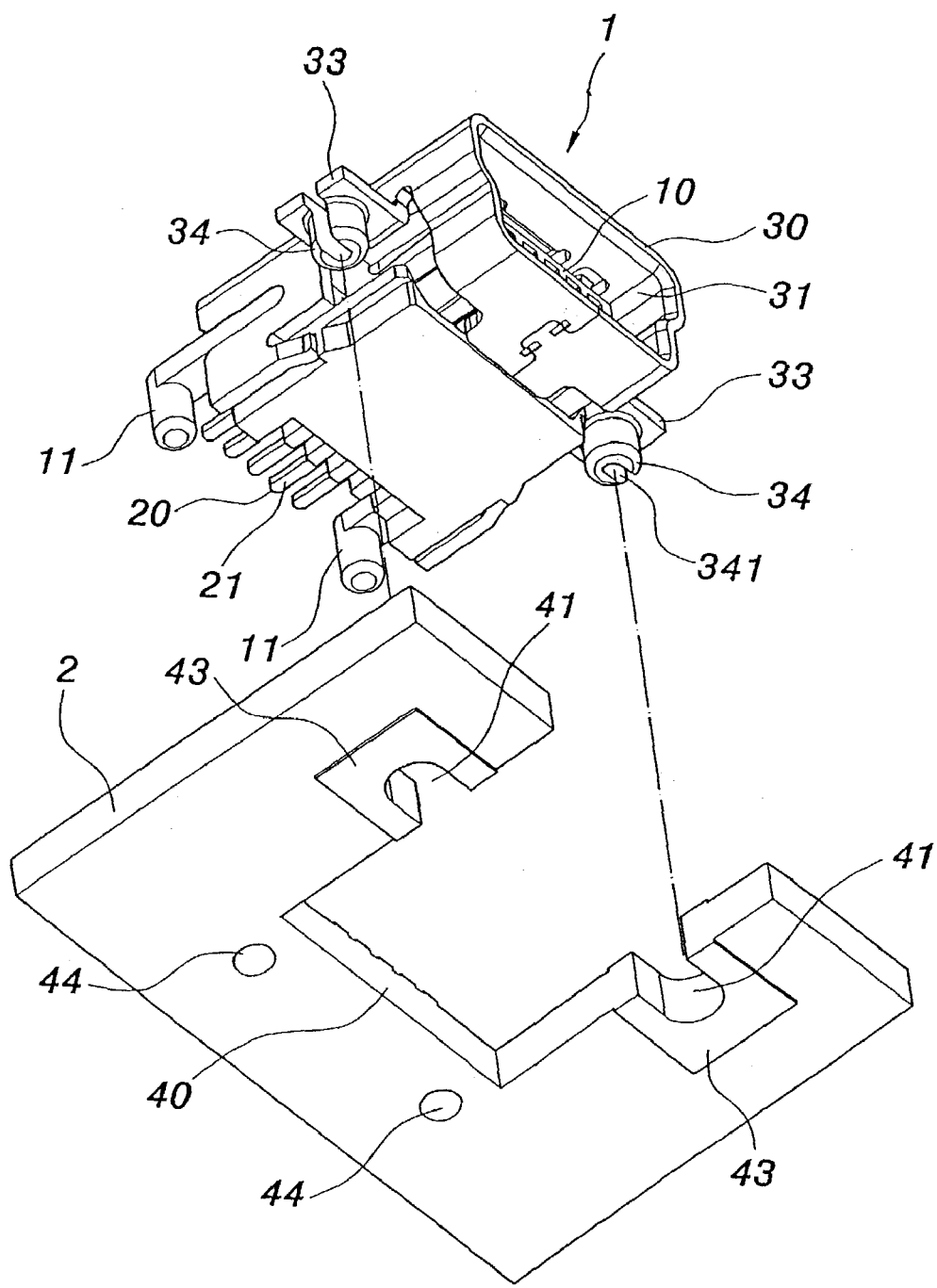
FIG. 7 is an exploded perspective view of the third embodiment of the invention.
Figure 8:
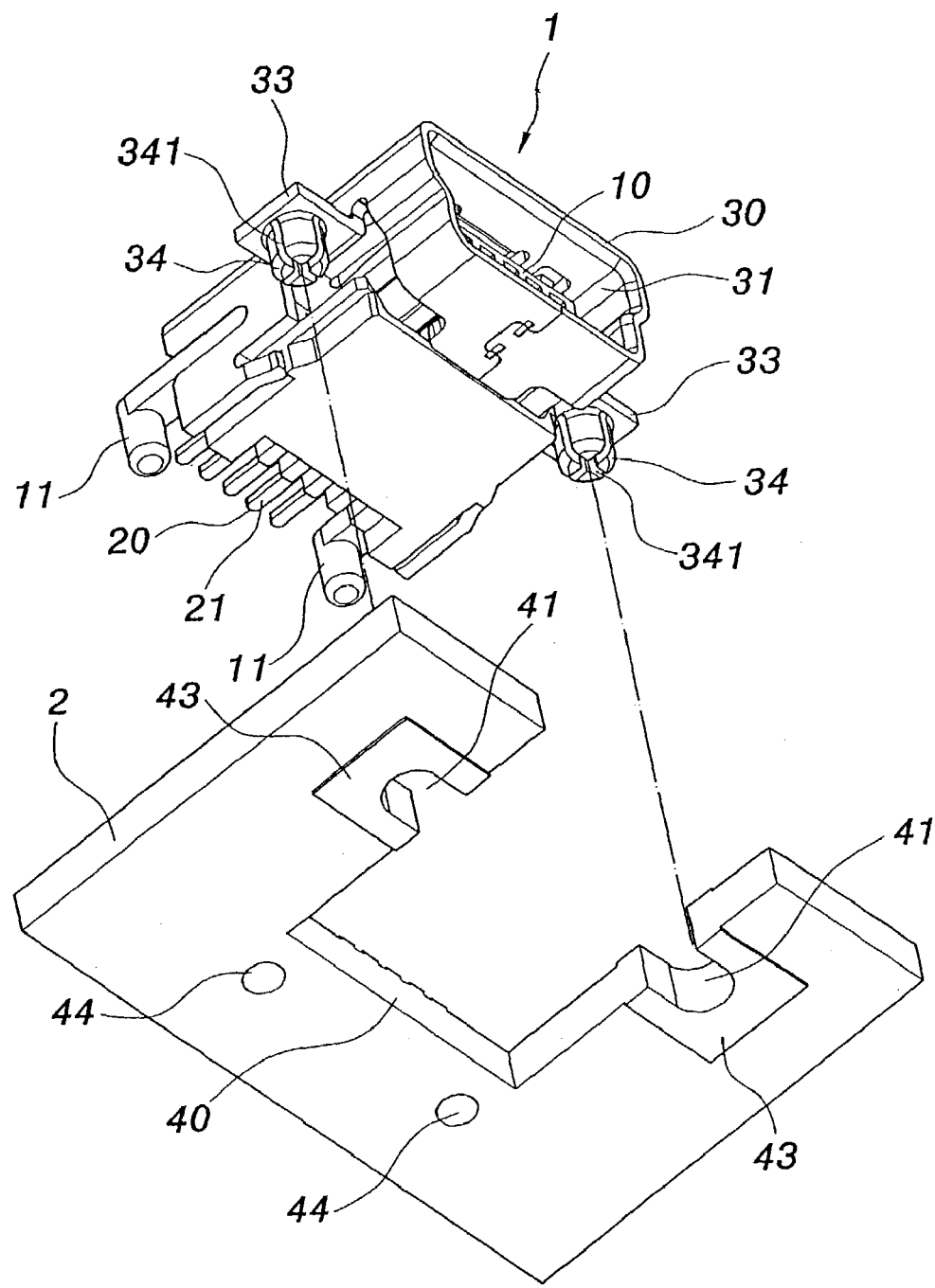
FIG. 8 is an exploded perspective view of the fourth embodiment of the invention.

In addition, referring to FIGS. 7 and 8, the side wall of the post 34 of the invention may be provided with one or a plurality of slots 341 so that the post 34 can be formed with a relatively large outer diameter, and the outer diameter thereof can have flexibility so that the two posts 34 can be forced into the notches 41 to retain the notches 41 firmly, thereby enabling the electrical connector 1 and the circuit board 2 to be more firmly positioned relative to each other and will not vibrate, loosen, or disengage, and can withstand plugging and unplugging.

Figure 9:
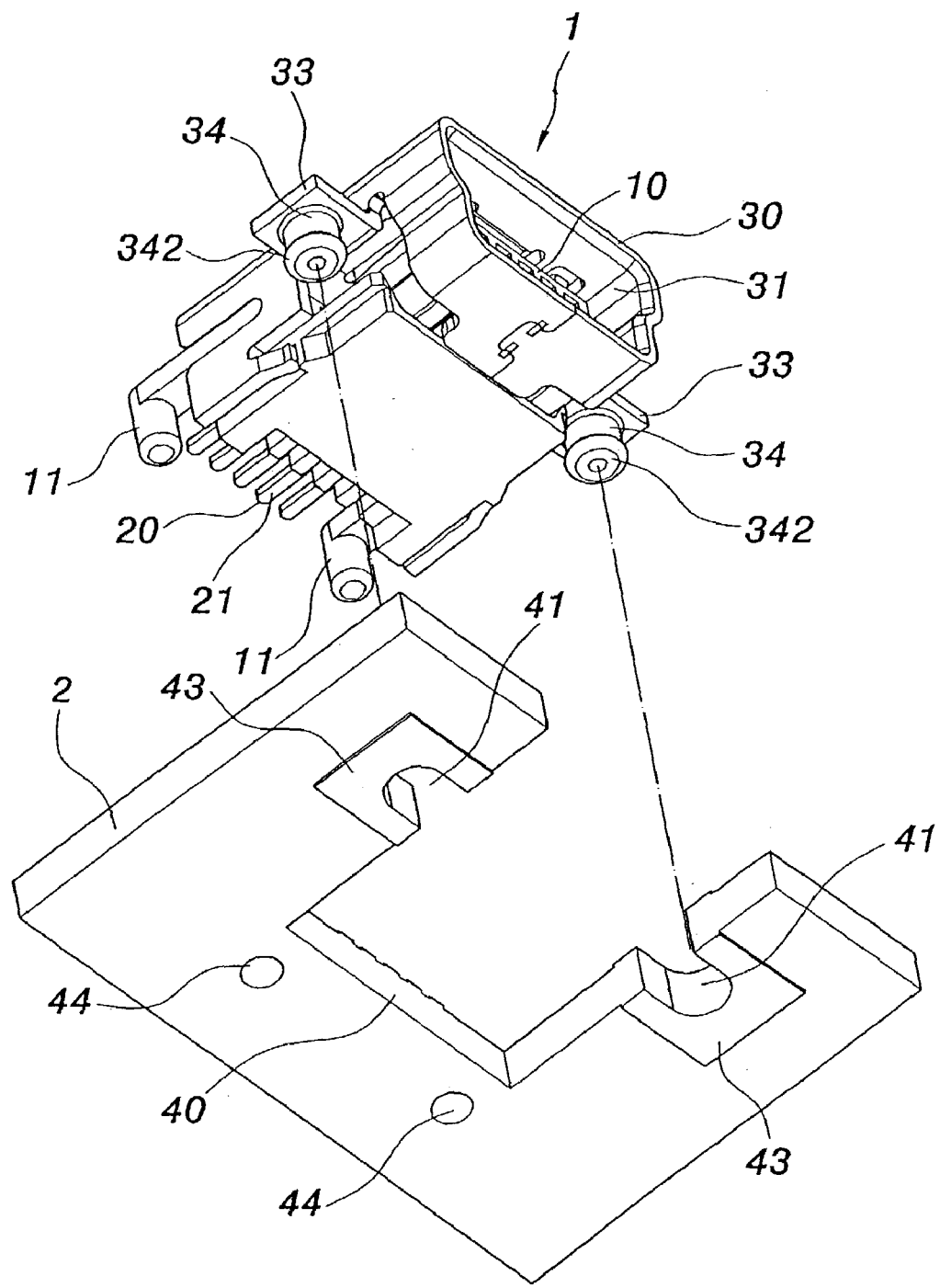
FIG. 9 is an exploded perspective view of the fifth embodiment of the invention.
Figure 10:
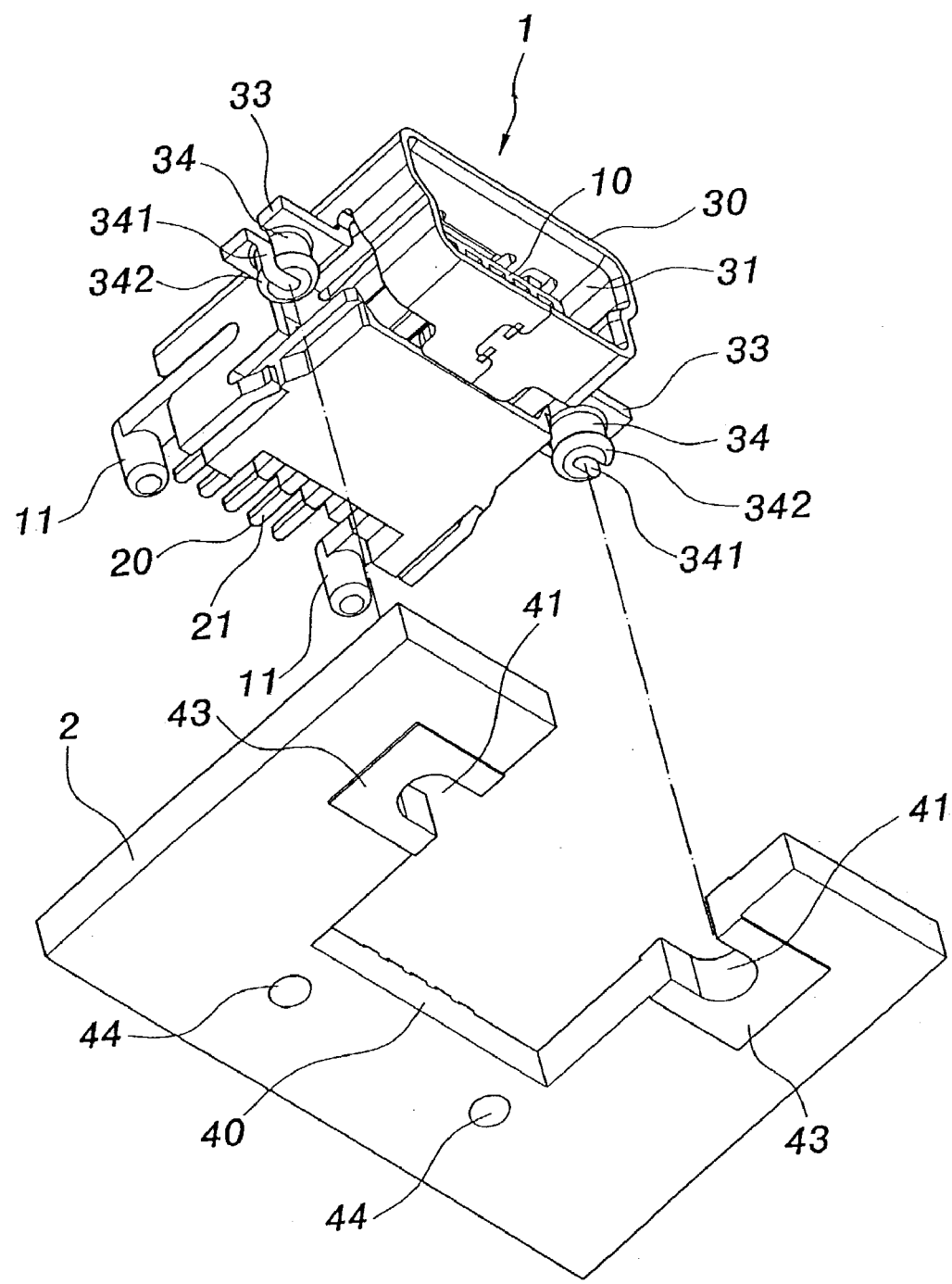
FIG. 10 is an exploded perspective view of the sixth embodiment of the invention.
Figure 11:
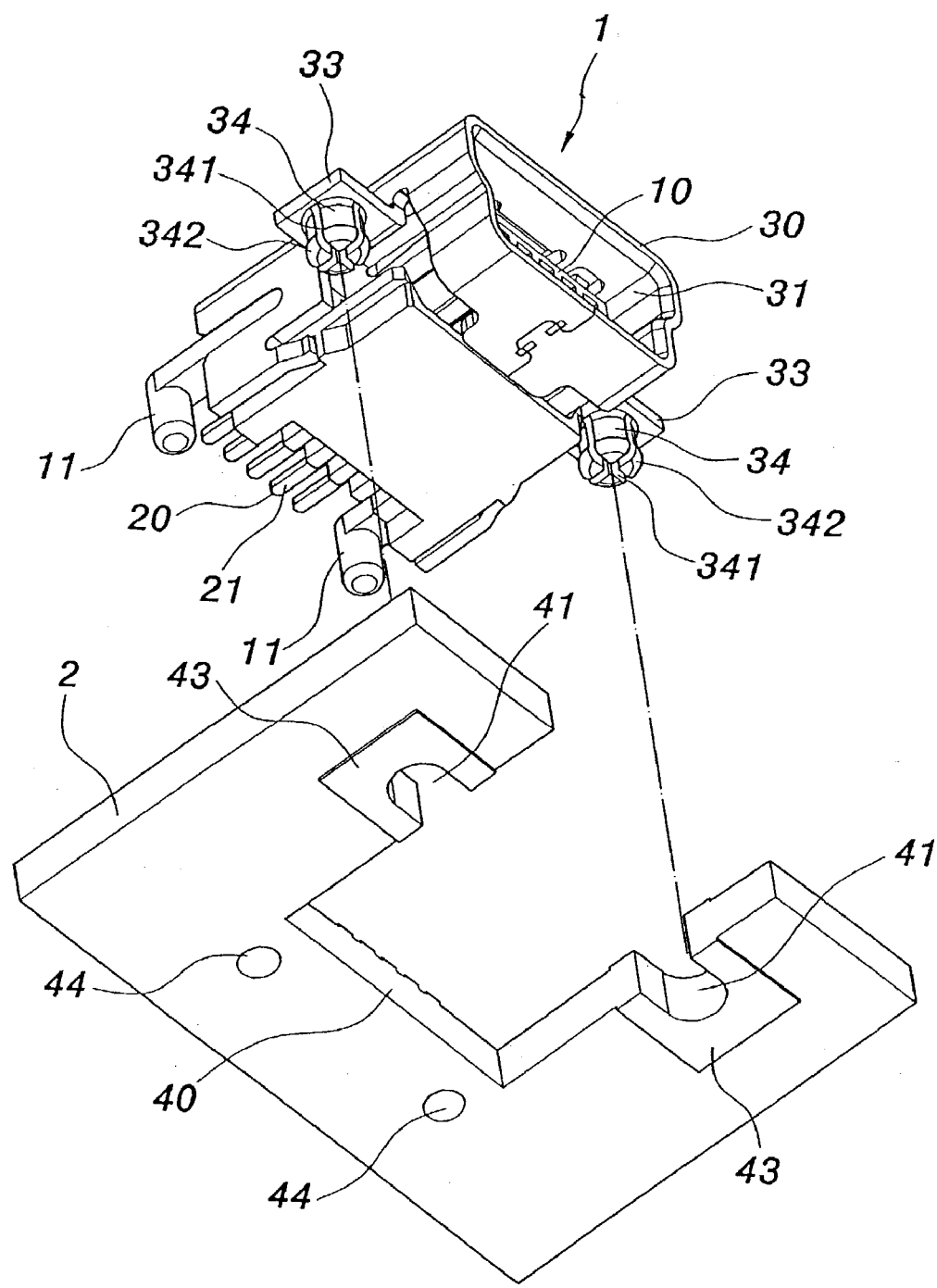
FIG. 11 is an exploded perspective view of the seventh embodiment of the invention.

Furthermore, referring to FIG. 9, the lower end of the post 34 maybe provided with a flange 342. When the two posts 34 fit into the two notches 41, the flanges 342 can extend outwardly of the bottom edge of the notches 41 to engage the bottom edges of the notches 41. Hence, the posts 34 can be positioned more firmly in the notches 41. The two posts 34 and the two lower solder plates 43 can be soldered or not soldered. In addition, referring to FIGS. 10 and 11, the posts 34 of the invention can also be provided with both slots 341 and flanges 342.

While a preferred embodiment of the present invention is shown and described, it is envisioned that those skilled in the art may devise various modifications of the present invention without departing from the spirit and scope of the appended claims.

The invention claimed is:

1. An electrical connector for use with a circuit board having at least one notch therein, the connector comprising:
a housing, the housing including an inner housing of an insulating material and an outer housing of a shielding material, the inner housing and the outer housing being two separable housings, the outer housing being next to the inner housing and substantially surrounding the inner housing, at least one wing extending from the outer housing, the wing being generally parallel to a top surface of the circuit board, and a post extending downwardly from the wing, the post being received within the circuit board notch and wherein the post does not extend through any portion of the inner housing.

2. The electrical connector as claimed in claim 1, wherein the post includes at least one slot, the slot allowing the post to be more easily received within the notch.

3. The electrical connector as claimed in claim 1, wherein the post includes a flange at a lower end of the post.

4. The electrical connector as claimed in claim 1, wherein the post is generally cylindrical, the post including a flange at a lower end of the post, the diameter of the flange being greater that the diameter of the post.

5. The electrical connector as claimed in claim 1, wherein the post includes a flange at a distal end of the post.

6. The electrical connector as claimed in claim 1, wherein the connector is received within an aperture on the circuit board.

7. The electrical connector as claimed in claim 1, wherein the outer housing is formed of a metal material.

8. An electrical connector and circuit board securing structure, comprising
an electrical connector, the electrical connector including a housing, the housing including an inner housing of an insulating material and an outer housing of a shielding material, the inner housing and the outer housing being two separable housings, the outer housing being next to the inner housing and substantially surrounding the inner housing, the outer housing provided with a wing, and a post extending downwardly from the wing and wherein the post does not extend through any portion of the inner housing; and a circuit board, the circuit board including an aperture extending rearward from a front edge of the circuit board for receiving the electrical connector, the wing being generally parallel to a top surface of the circuit board, the aperture having two sides having notches therein, the posts being received within respective notches.

9. The electrical connector and circuit board securing structure as claimed in claim 8, wherein the post includes at least one slot, the slot allowing the post to be more easily received within the notch.

10. The electrical connector and circuit board securing structure as claimed in claim 8, wherein the post includes a flange at a lower end of the post.

11. The electrical connector and circuit board securing structure as claimed in claim 8, wherein the post is generally cylindrical, the post including a flange at a lower end of the post, the diameter of the flange being greater that the diameter of the post.

12. The electrical connector and circuit board securing structure as claimed in claim 8, wherein the post includes a flange at a distal end of the post.

13. The electrical connector and circuit board securing structure as claimed in claim 8, wherein the post has a side wall provided with one or a plurality of slots such that the post can be forced into the notch, the post having a lower end provided with a flange, the flange extending outwardly of a bottom edge of the notch to engage the notch.

14. The electrical connector and circuit board securing structure as claimed in claim 8, wherein the notches have top portions with peripheries each provided with an upper solder plate for soldering to the wings on the two sides of the outer housing.

15. The electrical connector and circuit board securing structure as claimed in claim 14, wherein the notches have bottom portions with peripheries each provided with a lower solder plate for soldering to the two posts.

16. The electrical connector and circuit board securing structure as claimed in claim 14, wherein the outer housing is formed of a metal material.

17. The electrical connector and circuit board securing structure as claimed in claim 8, wherein the notches have bottom portions with peripheries each provided with a lower solder plate for soldering to the two posts.

* * * * *